US010134620B2

(12) United States Patent
Katsuda et al.

(10) Patent No.: US 10,134,620 B2
(45) Date of Patent: Nov. 20, 2018

(54) ROBOT SYSTEM AND INCLINE DETECTION METHOD

(71) Applicant: KABUSHIKI KAISHA YASKAWA DENKI, Kitakyushu-shi, Fukuoka (JP)

(72) Inventors: Shinichi Katsuda, Fukuoka (JP); Takashi Minami, Fukuoka (JP)

(73) Assignee: KABUSHIKI KAISHA YASKAWA DENKI, Kitakyushu-shi, Fukuoka (JP)

( * ) Notice: Subject to any disclaimer, the term of this patent is extended or adjusted under 35 U.S.C. 154(b) by 0 days.

(21) Appl. No.: 15/828,445

(22) Filed: Dec. 1, 2017

(65) Prior Publication Data

US 2018/0090357 A1    Mar. 29, 2018

Related U.S. Application Data

(63) Continuation of application No. PCT/JP2015/066317, filed on Jun. 5, 2015.

(51) Int. Cl.
*B25J 19/02* (2006.01)
*H01L 21/677* (2006.01)
(Continued)

(52) U.S. Cl.
CPC ..... *H01L 21/67736* (2013.01); *B25J 11/0095* (2013.01); *B25J 19/02* (2013.01);
(Continued)

(58) Field of Classification Search
CPC .............. H01J 19/67736; B25J 19/02; H01L 21/67736
(Continued)

(56) References Cited

U.S. PATENT DOCUMENTS 5,376,785 A * 12/1994 Chin ................. G01D 5/30
250/214 PR
6,468,022 B1 * 10/2002 Whitcomb ........ H01L 21/67796
414/757
(Continued)

FOREIGN PATENT DOCUMENTS

JP    H5-102286    4/1993
JP    2000-124289    * 4/2000
(Continued)

OTHER PUBLICATIONS

International Search Report dated Aug. 25, 2015 for PCT/JP2015/066317.
(Continued)

*Primary Examiner* — Paul T Chin

(57) ABSTRACT

A robot system includes: a robotic hand configured to load and unload a workpiece into and from a cassette in which a plurality of workpieces are aligned in a first direction; a sensor configured to detect the workpiece; a transporter configured to change a relative position of the sensor with respect to the cassette in the first direction and in a second direction; and circuitry configured to: control the transporter to arrange the sensor at a first position; command the sensor to scan in the first direction, to acquire first mapping data; control the transporter to arrange the sensor at a second position by changing the relative position of the sensor in the second direction; command the sensor to scan in the first direction, to acquire second mapping data; and determine that one or more of the workpieces are inclined based on the first and second mapping data.

21 Claims, 7 Drawing Sheets

(51) Int. Cl.
*B25J 11/00* (2006.01)
*H01L 21/67* (2006.01)
*B25J 15/00* (2006.01)
*H01L 21/687* (2006.01)

(52) U.S. Cl.
CPC ...... *H01L 21/677* (2013.01); *H01L 21/67265* (2013.01); *H01L 21/67766* (2013.01); *B25J 15/0014* (2013.01); *H01L 21/68707* (2013.01)

(58) Field of Classification Search
USPC .......................................................... 294/213
See application file for complete search history.

(56) References Cited

U.S. PATENT DOCUMENTS

| | | | | |
|---|---|---|---|---|
| 8,146,973 | B2* | 4/2012 | Roberts | H01L 21/67742 294/213 |
| 8,622,451 | B2* | 1/2014 | Mantz | H01L 21/68707 294/103.1 |
| 9,120,233 | B2* | 9/2015 | Moore | B25J 13/08 |

| | | | |
|---|---|---|---|
| 2012/0290124 | A1 | 11/2012 | Kimura |
| 2014/0178162 | A1 | 6/2014 | Morikawa et al. |
| 2015/0179491 | A1 | 6/2015 | Katsuda et al. |
| 2015/0300960 | A1 | 10/2015 | Morikawa et al. |
| 2016/0111312 | A1 | 4/2016 | Yoshida et al. |

FOREIGN PATENT DOCUMENTS

| | | |
|---|---|---|
| JP | 2002-141394 | 5/2002 |
| JP | 2005-285799 | 10/2005 |
| JP | 2007-148778 | 6/2007 |
| JP | 5447431 | 1/2014 |
| JP | 2014-116426 | 6/2014 |
| JP | 2014-130866 | 7/2014 |
| JP | 2014-143388 | 8/2014 |
| JP | 2015-119070 | 6/2015 |

OTHER PUBLICATIONS

International Preliminary Report on Patentability with Written Opinion dated Dec. 14, 2017 for PCT/JP2015/066317.

* cited by examiner

ROBOT SYSTEM AND INCLINE DETECTION METHOD

CROSS-REFERENCE TO RELATED APPLICATION

This application is a continuation application of PCT Application No. PCT/JP2015/066317, filed Jun. 5, 2015, the entire contents of which are incorporated herein by reference.

BACKGROUND

1. Field

The present disclosure relates to a robot system and an incline detection method.

2. Description of the Related Art

Japanese Patent No. 5447431 describes a robot system that includes a storage unit that stores a plurality of workpieces in multiple stages in the vertical direction, and a robotic hand that transfers the workpiece stored in the storage unit. In this robot system, the permission or the prohibition of entry of the robotic hand into a space immediately below a workpiece is determined based on the clearance between the workpieces stored in the storage unit.

SUMMARY

A robot system according to one aspect of the present disclosure includes: a robotic hand configured to load and unload a workpiece into and from a cassette in which a plurality of workpieces are accommodated and aligned in a first direction; a sensor configured to detect the workpiece; a transporter configured to change a relative position of the sensor with respect to the cassette in the first direction and in a second direction intersecting the first direction; and circuitry configured to: control the transporter so as to arrange the sensor at a first position; command the sensor to scan in the first direction while the transporter changes the relative position of the sensor in the first direction, with the sensor arranged at the first position, so as to acquire first mapping data indicating placement of the workpieces in the first direction; control the transporter so as to arrange the sensor at a second position by changing the relative position of the sensor in the second direction; command the sensor to scan in the first direction while the transporter changes the relative position of the sensor in the first direction, with the sensor arranged at the second position, so as to acquire second mapping data indicating the placement of the workpieces in the first direction; and determine that one or more of the workpieces are inclined based on the first mapping data and the second mapping data.

An incline detection method according to one aspect of the present disclosure includes: arranging a sensor at a first position with respect to a cassette including multiple storage locations in which a plurality of workpieces are aligned in a first direction; commanding the sensor to scan in the first direction, while changing a relative position of the sensor with respect to the cassette, with the sensor arranged at the first position; acquiring first mapping data with the sensor arranged at the first position, the first mapping data indicating placement of the workpieces in the first direction; arranging the sensor at a second position different from the first position by changing the relative position of the sensor in a second direction intersecting the first direction; commanding the sensor to scan in the first direction, while changing the relative position of the sensor in the first direction, with the sensor arranged at the second position; acquiring second mapping data with the sensor arranged at the second position, the second mapping data indicating the placement of the workpieces in the first direction; determining that one or more of the workpieces are inclined based on the first mapping data and the second mapping data; and prohibiting entry of the robotic hand into at least one of the storage locations in response to determining that one or more of the workpieces are inclined.

DESCRIPTION OF EMBODIMENT

The following describes an exemplary embodiment in detail while referring to the accompanying drawings. In the following description, identical constituent elements or the constituent elements having the identical function are denoted by identical reference signs, and redundant explanations are omitted. For the sake of convenience of explanation, an X axis, a Y axis, and a Z axis are appended to the drawings. The X axis and the Y axis, within a horizontal plane, extend in directions orthogonal to each other. The Z axis extends in a vertical direction from the horizontal plane.

A robot system according to the present disclosure includes a robotic hand, a sensor, a transporter, a first scan controller, a second scan controller, and an incline detector. The robotic hand loads and unloads a workpiece into and from a cassette in which a plurality of workpieces are accommodated in multiple stages. The sensor detects a workpiece. The transporter changes the relative positions of the sensor and the cassette in a first direction in which the workpieces are aligned and a second direction intersecting the first direction. The first scan controller controls the transporter so as to command the sensor to scan in the first direction and acquires first mapping data indicating the placement of the workpiece in the first direction. The second scan controller controls the transporter so as to arrange the sensor at a second position different from a first position in the second direction and command the sensor to scan in the first direction, and acquires second mapping data indicating the placement of the workpiece in the first direction. The incline detector detects the incline of the workpiece based on the first mapping data and the second mapping data.

Figure 1:
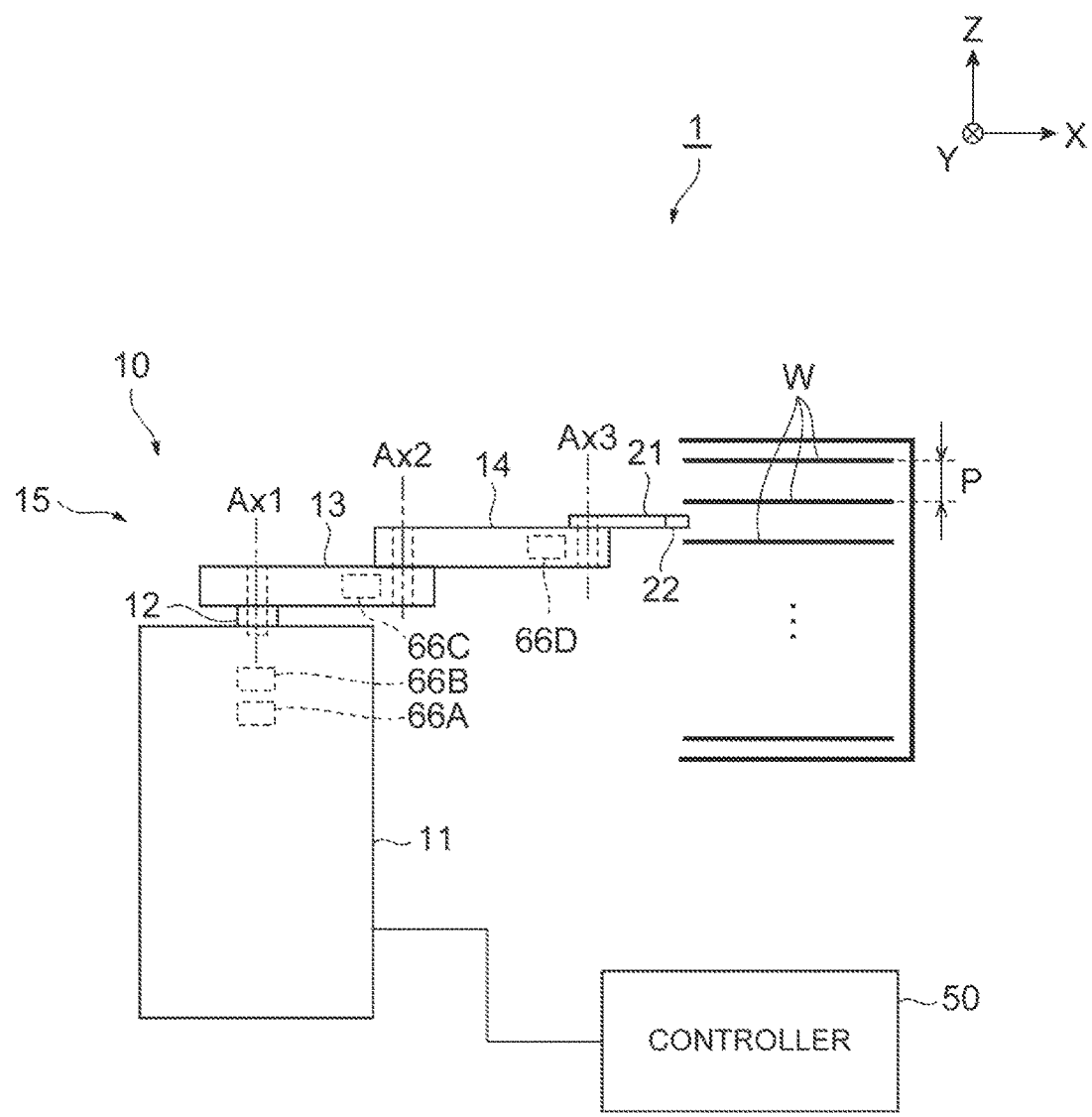
FIG. 1 is a schematic diagram of a robot system according to an embodiment.

FIG. 1 illustrates a robot system 1 as one example. The robot system 1 includes a robot 10 and a controller 50. The robot 10 includes a base 11, an elevating unit 12, a first arm 13, a second arm 14, a robotic hand 21, and a sensor 22.

The base 11 is secured to a floor surface of a placement area of the robot 10. The elevating unit 12 projects vertically upward from the base 11 and is capable of ascending and descending along an axis Ax1 that is vertical, e.g., oriented along a Z axis direction. The first arm 13 is coupled to an upper end portion of the elevating unit 12, extends in a horizontal direction from the upper end portion of the elevating unit 12, and is capable of swinging about the axis Ax1. The second arm 14 is coupled to a distal end portion of the first arm 13, extends in the horizontal direction from the distal end portion of the first arm 13, and is capable of swinging about an axis Ax2 that is vertical. The robotic hand 21 is coupled to a distal end portion of the second arm 14 and is capable of rotating around an axis Ax3 that is vertical.

The robot 10 includes an actuator 66A that makes the elevating unit 12 ascend and descend along the axis Ax1, an actuator 66B that makes the first arm 13 swing about the axis Ax1, an actuator 66C that makes the second arm 14 swing about the axis Ax2, and an actuator 66D that makes the robotic hand 21 rotate around the axis Ax3. In other words, the actuator 66A moves the robotic hand 21 along the Z axis direction and the actuators 66B, 66C, and 66D move the robotic hand 21 along the X axis direction. Examples of the actuators include an electrical actuator that uses an electric motor as a power source.

Figure 2:
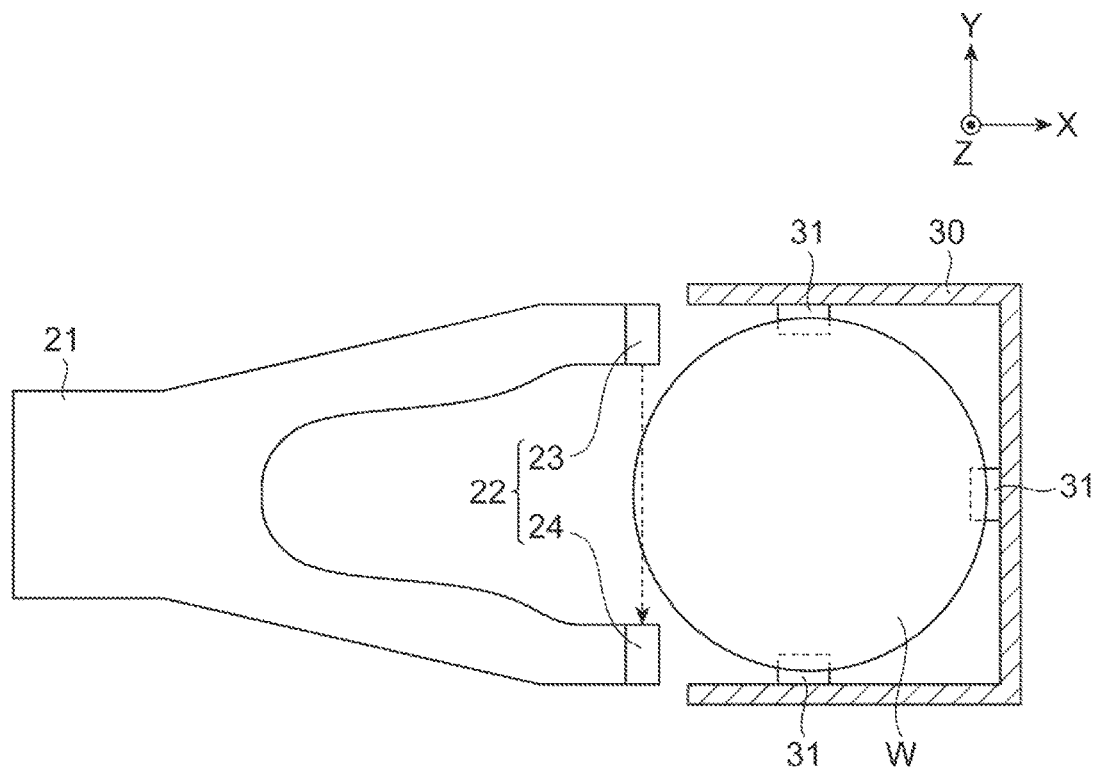
FIG. 2 is a plan view illustrating a robotic hand, a sensor, and a workpiece.

The robotic hand 21 is capable of placing a workpiece W in a designated location, such as by loading and unloading the workpiece W into and from a cassette 30. As illustrated in FIG. 2, the shape of the robotic hand 21 is in a substantially Y-shape in planar view (that is, when viewed from the Z axis direction), and has two distal end portions.

The sensor 22 detects the workpiece W, for example. As one example, the sensor 22 detects the presence or absence of the workpiece W. The sensor 22 is a transmissive optical sensor, for example, and detects an object between a light projecting unit and a light receiving unit in response to a light receiving condition of light emitted from the light projecting unit toward the light receiving unit. As a specific example, as illustrated in FIG. 2, the sensor 22 includes a light projecting unit 23, a light receiving unit 24, and an amplifier that is not depicted. The light projecting unit 23 and the light receiving unit 24 are provided on one distal end of the robotic hand 21 and on the other distal end thereof respectively and are facing each other. The light projecting unit 23 emits light toward the light receiving unit 24 side. The amplifier is coupled to the light projecting unit 23 and the light receiving unit 24 via optical fibers not depicted. The amplifier sends, via the optical fiber, the light for emitting to the light projecting unit 23 and receives, via the optical fiber, the light incident on the light receiving unit 24.

The robot 10 loads and unloads the workpiece W into and from the cassette 30. The workpiece W is a plate-like work object. As illustrated in FIG. 2, the shape of the workpiece W in planar view is in a circular shape, for example. The term circular shape includes objects having cutouts (for example, notches and orientation flats), protrusions and the like fat formed on a part of the peripheral edge, and the workpiece W is assumed to be a circular shape if most of the peripheral edge constitutes a circumference. In other examples, the shape of the workpiece W in planar view may be in a rectangular shape or other shapes. The workpiece W may be a semiconductor wafer, an LCD substrate, and a glass substrate, for example.

The cassette 30 has a substantially rectangular parallelepiped outer shape and is open in one direction orthogonal to the vertical direction (for example, the X axis negative direction). The inside of the cassette 30 is divided into slots in multiple stages by projecting portions 31. The projecting portions 31 support the peripheral edge portion of the horizontal workpiece W. The slots are arranged at equal distances having a certain pitch P (FIG. 7) in the vertical direction (direction along the Z axis). The slot defines a planned storage location that is a location at which the workpiece W is planned to be accommodated. For example, a lower portion in each slot is the planned storage location of the workpiece W, as described further with respect to FIG. 6.

The elevating unit 12, the first arm 13, and the second arm 14 of the robot 10 make the robotic hand 21 move along the Z axis direction (the above-described first direction) in which the workpieces W are aligned in the cassette 30. The elevating unit 12, the first arm 13, and the second arm 14 further make the robotic hand 21 move along the X axis direction (the above-described second direction) that is directed toward the back side of the cassette 30 from the opening of the cassette 30. That is, the robot 10 includes the above-described transporter (transporter 15 in the drawings).

The controller 50 controls the robot 10 so as to load and unload the workpiece W into and from the cassette 30 by using the robotic hand 21. The controller 50 further executes operations comprising acquiring the first mapping data indicating the placement of the workpiece W in the first direction by arranging the sensor 22 at the first position and commanding the sensor 22 to scan in the first direction, acquiring the second mapping data indicating the placement of the workpiece W in the first direction by arranging the sensor 22 at the second position and commanding the sensor 22 to scan in the first direction, and detecting the incline of the workpiece W based on the first mapping data and the second mapping data.

The controller 50 may also execute operations comprising detecting that an abnormal value, such as a value that is deviated with respect to the planned storage location of the workpiece W in the cassette 30, is included in at least one of the first mapping data and the second mapping data, and detecting the incline of the workpiece W based on the abnormal value when at least one of the first mapping data and the second mapping data contains an abnormal value. The controller 50 may collate (e.g., collect and compare) the first mapping data and the second mapping data and detect the incline of the workpiece W based on difference between the first mapping data and the second mapping data.

The controller 50 may further calculate an angle of incline of the workpiece W when the controller 50 detects that the workpiece W is inclined. The controller 50 may calculate the angle of incline of the workpiece W based on the abnormal value and the value closest to the abnormal value out of the values included in the other of the first mapping data and the second mapping data when either one of the first mapping data and the second mapping data contains an abnormal value.

The controller 50 may additionally detect whether the workpiece W is positioned across at least two of the planned storage locations in a plurality of stages based on the angle of incline of the workpiece W and the distance between the planned storage locations of the workpiece W.

Figure 3:
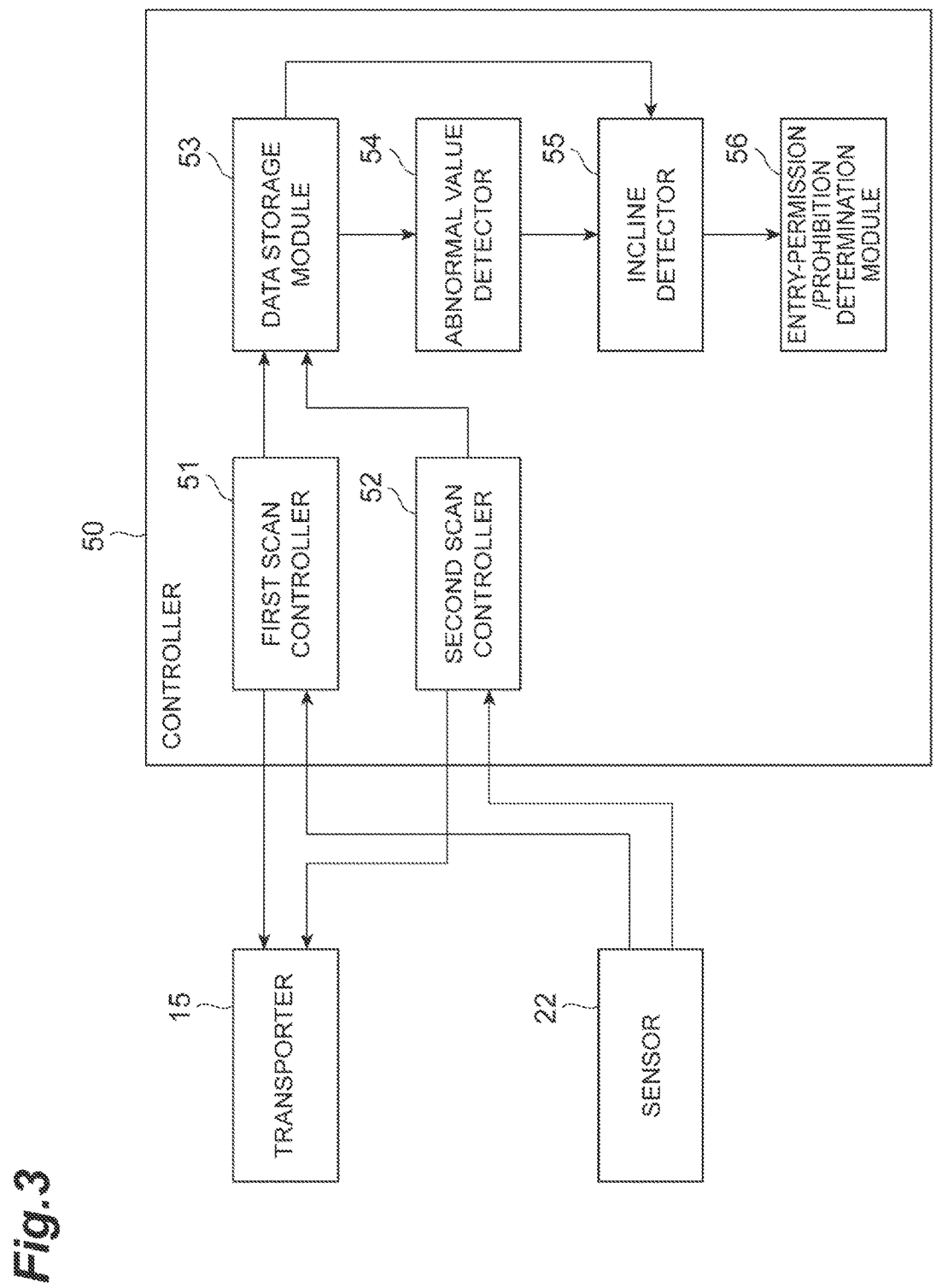
FIG. 3 is a functional block diagram of a controller.

The following describes in detail a specific example of the controller 50. As illustrated in FIG. 3, the controller 50 includes, as functional modules, a first scan controller 51, a second scan controller 52, a data storage module 53, an abnormal value detector 54, an incline detector 55, and an entry permission/prohibition determination module 56.

The first scan controller 51 controls the transporter 15 so as to command the sensor 22 to scan in the Z axis direction after controlling the transporter 15 so as to arrange the sensor 22 at the first position, and acquires the first mapping data indicating the placement of the workpiece W in the Z axis direction.

To command the sensor 22 to scan in the Z axis direction means to make the relative position of the sensor 22 with respect to the cassette 30 move along the Z axis direction and to detect the presence or absence of the workpiece W in at least a part of the slots of the cassette 30. The sensor 22 is scanned in the Z axis direction without changing the position of the sensor 22 in a direction orthogonal to the Z axis (for example, the X axis direction or a Y axis direction). When making the relative position of the sensor 22 move with respect to the cassette 30, the sensor 22 may be made to move while the cassette 30 remains stationary, or the cassette 30 may be made to move while the sensor 22 remains stationary. The direction of movement of the relative position of the sensor 22 with respect to the cassette 30 may be upward or downward.

At the time of scanning by the sensor 22, when the workpiece W is located between the light projecting unit 23 of the sensor 22 and the light receiving unit 24 thereof, the sensor 22 detects a decreased amount of received light in the light receiving unit 24 as compared with when the workpiece W is absent. The first scan controller 51 acquires a Z coordinate value of the sensor 22 from the transporter 15 at the time of detecting the decrease in the amount of received light in the light receiving unit 24, and sets it as the first mapping data.

After controlling the transporter 15 so as to arrange the sensor 22 at the second position different from the first position, the second scan controller 52 controls the transporter 15 so as to command the sensor 22 to scan in the Z axis direction, and acquires the second mapping data indicating the placement of the workpiece W in the Z axis direction. The second scan controller 52 sets the Z coordinate value of the sensor 22 acquired from the transporter 15 as the second mapping data by the same procedure as that of the first scan controller 51.

The data storage module 53 stores the first mapping data acquired by the first scan controller 51 and the second mapping data acquired by the second scan controller 52.

The abnormal value detector 54 detects an abnormal value included in the first mapping data and the second mapping data stored in the data storage module 53.

The incline detector 55 detects, calculates, compares or otherwise determines the amount or state of incline of the workpiece W based on the first mapping data and the second mapping data stored in the data storage module 53.

The entry permission/prohibition determination module 56 determines the permission or the prohibition of entry of the robotic hand 21 into a space adjacent to the inclined workpiece W based on the amount, angle or state of incline, as determined by the incline detector 55.

Figure 4:
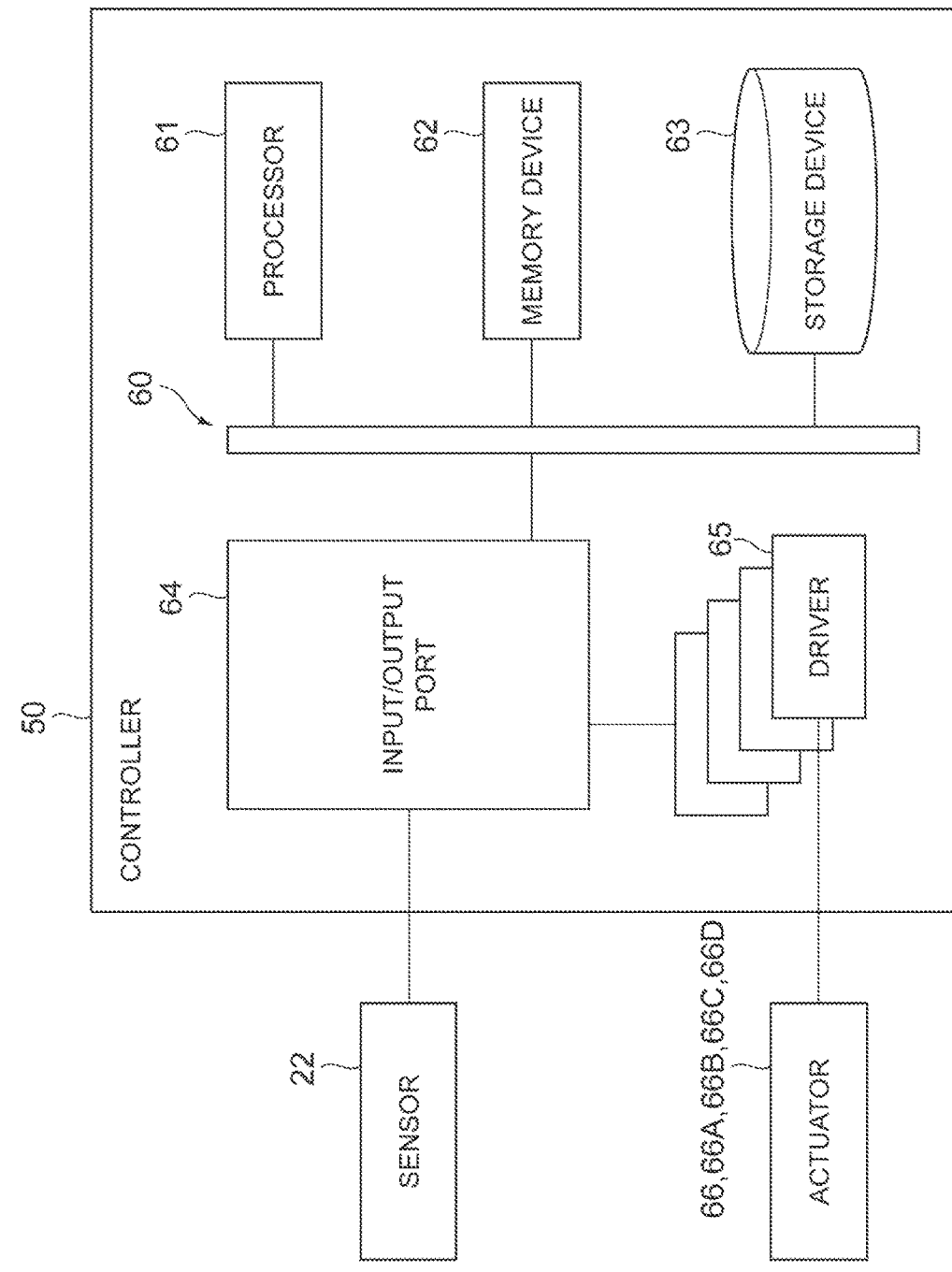
FIG. 4 is a hardware configuration diagram of the controller.

The hardware of the controller 50 is constituted by a single or a plurality of control computers, for example. The controller 50 includes, as the configuration on the hardware, circuitry 60 illustrated in FIG. 4, for example. The circuitry 60 includes a processor 61, a memory device 62, a storage device 63, an input/output port 64, and drivers 65. The drivers 65 are circuits to drive various actuators 66 of the robot system 1. The input/output port 64, in addition to carrying out input and output of external signals including a signal from the sensor 22, also carries out input and output of signals for the drivers 65, for example. The processor 61 constitutes the above-described functional modules by executing a program in collaboration with at least one of the memory device 62 and the storage device 63 and by executing the input and output of signals via the input/output port 64.

The hardware configuration of the controller 50 is not necessarily limited to the one that constitutes the functional modules by the execution of the program. For example, the controller 50 may be the one that constitutes those functional modules by dedicated logic circuits or by an application specific integrated circuit (ASIC) in which the foregoing logic circuits are integrated.

Next, with reference to FIG. 5, an incline detection method carried out by using the robot system 1 will be described. First, the controller 50 executes Step S11. At Step S11, the first scan controller 51 controls the robot 10 such that the sensor 22 is arranged at the first position with respect to the cassette 30.

Then, the controller 50 executes Step S12. At Step S12, the first scan controller 51 controls the robot 10 so as to command the sensor 22 to scan in the Z axis direction, acquires the first mapping data, and makes the data storage module 53 store it.

Then, the controller 50 executes Step S13. At Step S13, the second scan controller 52 controls the robot 10 such that the sensor 22 is arranged at the second position with respect to the cassette 30.

Then, the controller 50 executes Step S14. At Step S14, the second scan controller 52 controls the robot 10 so as to command the sensor 22 to scan in the Z axis direction, acquires the second mapping data, and makes the data storage module 53 store it.

The incline detector 50 then detects the incline of the workpiece W based on the first mapping data and the second mapping data by executing the following Step S15 to Step S17.

First, the controller executes Step S15. At Step S15, the abnormal value detector 54 determines whether an abnormal value is included in the first mapping data and/or the second mapping data.

An abnormal value is a Z coordinate value that is not possible to assume when the workpiece W is horizontally placed properly on the projecting portions 31, for example. The origin of the Z coordinate can be placed at the lower bottom portion of the cassette 30, for example, and as further discussed below with respect to FIG. 6. In this case, the Z coordinate is equal to the height from the bottom surface of the cassette 30. The determination of the presence of an abnormal value by the abnormal value detector 54 can be carried out in the following method, for example. That is, the abnormal value detector 54 may determine that an abnormal value is included in the first mapping data or the second mapping data when the first mapping data and the second mapping data contain data that does not match with each other. The case that one of the first mapping data and the second mapping data contains data that does not match with each other means that the difference in data is greater than an acceptable level or a reference amount. Furthermore, by storing the initial Z coordinate of the workpiece W as reference data at the time that the workpiece W is horizontally accommodated in the cassette 30, the abnormal value detector 54 may determine that an abnormal value is included in the first mapping data or the second mapping data when there is a substantial difference between the reference data and the first mapping data or the second mapping data actually detected by the sensor 22.

At Step S15, if an abnormal value is not included in the first mapping data and the second mapping data, the controller 50 ends a series of processes without executing Step S16 to Step S17. If an abnormal value is included in the first mapping data and/or the second mapping data, the controller 50 executes Step S16.

At Step S16, the incline detector 55 detects the incline of the workpiece W. The incline of the workpiece W detected at Step S16 is the incline in the X axis direction (the direction in which the workpiece W is loaded into and unloaded from the cassette 30) with respect to the horizontal plane, for example. In other words, the incline that is detected is the incline around the Y axis illustrated in FIG. 1.

Figure 6:
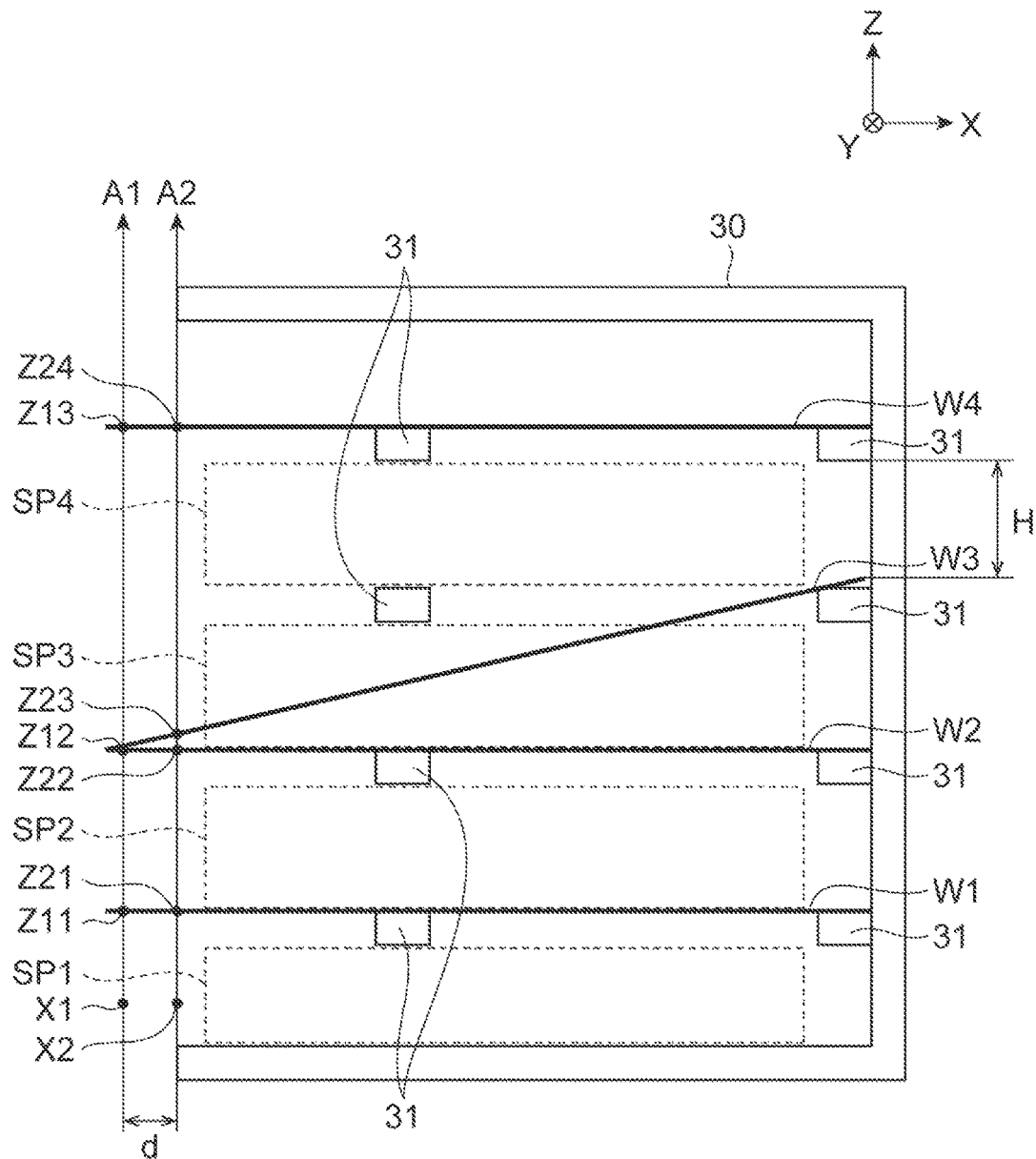
FIG. 6 is a diagram illustrating an example of placement of workpieces.

With reference to FIG. 6, a specific example of the incline detection method will be described. FIG. 6 illustrates an example placement of the workpieces W. In FIG. 6, four pieces of workpieces W1 to W4 are being accommodated in the cassette 30. At Step S11, the sensor 22 is arranged at a first position X1. At Step S12, the sensor 22 ascends along the arrow A1, and in the course of ascending, the first scan controller 51 detects the workpieces W1 to W4 at points Z11, Z12, and Z13 as the first mapping data. The point Z11 corresponds to the workpiece W1. The point Z12 corresponds to the workpieces W2 and W3. The point Z13 corresponds to the workpiece W4. At the point Z12, the horizontal workpiece W2, and the workpiece W3 that is placed above the workpiece W2 and is inclined with respect to the X axis direction are overlapped and are detected as a single workpiece.

Next, at Step S13, the sensor 22 is arranged at a second position X2. At Step S14, the sensor 22 ascends along the arrow A2, and in the course of ascending, the second scan controller 52 detects the workpieces W1 to W4 at points Z21, Z22, Z23, and Z24 as the second mapping data. The points Z21 to Z24 correspond to the workpieces W1 to W4, respectively.

At Step S15, the abnormal value detector 54 determines whether an abnormal value is included in the first mapping data and the second mapping data. In the example in FIG. 6, because the data corresponding to the point Z23 is not in the first mapping data, the point Z23 is determined to be an abnormal value.

Figure 7:
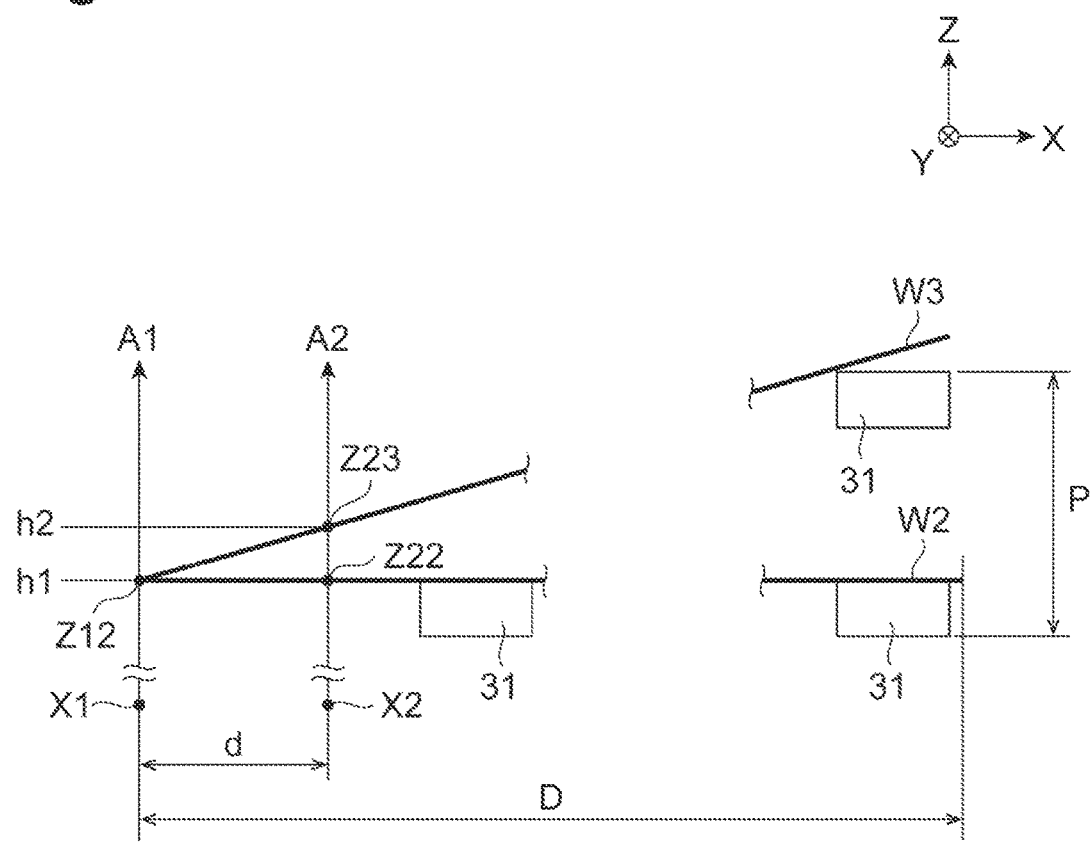
FIG. 7 is a diagram for explaining an incline detection method.

At Step S15, the incline detector 55 further detects the incline of the workpiece W3 that corresponds to the point Z23 by using the point Z23 that has been detected as the abnormal value. Moreover, the incline detector 55 detects the angle of incline of the workpiece W3. Specifically, the incline detector 55 collates the first mapping data and the second mapping data, and selects the point Z12 that is the closest to the point Z23 out of the data contained in the first mapping data. Accordingly, the incline detector 55 detects that the point Z12 and the point Z23 correspond to a single workpiece W3. Then, the incline detector 55, as illustrated in FIG. 7, divides the difference h2−h1 between the Z coordinate h2 of the point Z23 and the Z coordinate h1 of the point Z12, by a distance d between the first position X1 and the second position X2 in the X axis direction, and obtains a tangent value (h2−h1)/d of the angle of incline of the workpiece W3.

Referring back to FIG. 5, the controller 50 then executes Step S17. At Step S17, the entry permission/prohibition determination module 56 determines the permission or the prohibition of entry of the robotic hand 21 into a space adjacent to the workpiece W.

As one example, like the workpiece W3 illustrated in FIG. 6, when the workpiece W is inclined across the planned storage locations in two stages (the lower portion in a space SP3 and the lower portion of a space SP4), the entry permission/prohibition determination module 56 determines that entry of the robotic hand 21 into the space SP3 that is completely divided or at least partially blocked by the workpiece W3 is prohibited.

The example of the determination at Step S17 is carried out as follows. In the case of the example in FIGS. 6 and 7, by using the tangent value (h2−h1)/d of the angle of incline of the workpiece W3 and the diameter D of the workpiece W, the difference between the height of a back end of the workpiece W3 at the back side (X axis positive direction side) of the cassette 30 and the height of a front end of the workpiece W3 at the opening side (X axis negative direction side) of the cassette 30 is calculated as (h2−h1)/d×D. When this calculation result exceeds the pitch P of the slot, the entry permission/prohibition determination module 56 determines that the workpiece W3 is located across the planned storage locations in two stages or more, and determines that entry of the robotic hand 21 into the space SP3 that is completely divided or traversed by the workpiece W3 is prohibited.

Even if the entry of the robotic hand 21 into a space SP2 immediately below the workpiece W3 is possible, the unloading of the workpiece W may be difficult due to the incline of the workpiece W3. For example, unloading the workpiece W2 in contact with the workpiece W3 on the opening side of the cassette 30 is difficult, and unloading the workpiece W3 itself is also difficult. Thus, the entry permission/prohibition determination module 56 may determine that, in addition to the space SP3, entry of the robotic hand 21 into the space SP2 is also prohibited.

Moreover, the entry permission/prohibition determination module 56 may determine the permission or the prohibition of entry of the robotic hand 21 also on the space SP4 immediately above the inclined workpiece W3 based on the height of the clearance in the vertical direction. In the example in FIG. 6, the entry permission/prohibition determination module 56 may calculate a clearance height H between the topmost end portion of the workpiece W3 and the lower end portion of the projecting portion 31 that supports the workpiece W4, and determine the permission or the prohibition of entry by comparing the clearance height H with the necessary height obtained by adding a certain margin to the thickness of the robotic hand 21. In this case, the entry permission/prohibition determination module 56 may determine that the entry is prohibited when the clearance height H is equal to or less than the above-described necessary height, and determine that the entry is permitted when the clearance height H is greater than the above-described necessary height.

This ends a series of processes concerning the incline detection method. Subsequent processing is carried out depending on the inclined state of the detected workpiece W. For example, the controller 50 may control the robot 10 so as to perform the transportation work of the workpiece W while not making the robotic hand 21 enter the portions that have been determined the robotic hand 21 as being prohibited at Step S17. When it is determined that the workpiece W is inclined in the cassette 30, the workpiece W may be accommodated again in a horizontal condition by human hands or by another robot and the like. This series of processes may be performed each time the robot 10 inserts the robotic hand 21 into the cassette 30, or may be performed at scheduled intervals or only as needed.

As in the foregoing, the robot system 1 includes the robotic hand 21 configured to load and unload the workpiece W into and from the cassette 30; the sensor 22 configured to detect the workpiece W; the transporter 15 configured to change the relative positions of the sensor 22 and the cassette 30; the first scan controller 51 configured to control the transporter 15 so as to arrange the sensor 22 at the first position and command the sensor 22 to scan in the Z axis direction as the first direction, and acquires the first mapping data; the second scan controller 52 configured to control the transporter 15 so as to arrange the sensor 22 at the second position and command the sensor 22 to scan in the first direction, and acquires the second mapping data; and the incline detector 55 configured to detect the incline of the workpiece W based on the first mapping data and the second mapping data.

When only one of the first position and the second position is used to scan the workpieces W, one or more of the workpieces W may be overlapped and erroneously detected as a single workpiece W at the one scanning position. In contrast, according to the robot system 1 of the present disclosure, the incline of the workpiece W is detected based on the mapping data at different positions, namely at the first position and the second position. Accordingly, it is possible to detect the incline of the workpiece W more reliably.

The second direction may be the direction in which the robotic hand 21 loads and unloads the workpiece W into and from the cassette 30. In this case, it is possible to detect the incline of the workpiece W in the direction (depth direction of the cassette) that the robotic hand 21 loads and unloads the workpiece W into and from the cassette 30.

The robot system 1 may further include the abnormal value detector 54 configured to detect that an abnormal value that is deviated with respect to the planned storage location of the workpiece W in the cassette 30 is included in at least one of the first mapping data and the second mapping data. The incline detector 55 may detect the incline based on the abnormal value when at least one of the first mapping data and the second mapping data contains an abnormal value. When the workpiece W is inclined, an abdominal value is to be included in at least one of the first mapping data and the second mapping data. Thus it is possible to detect the incline of the workpiece W more reliably by being based on the abnormal value.

The abnormal value detector 54 may collate the first mapping data and the second mapping data to detect an abnormal value based on the difference between the first mapping data and the second mapping data. The difference between the first mapping data and the second mapping data corresponds to the amount of inclination of the workpiece W, such that the difference is greater the more that the workpiece is inclined. Thus it is possible to detect the incline of the workpiece W more reliably by detecting based on the difference between the first mapping data and the second mapping data.

The incline detector 55 may further detect an angle of incline of the workpiece W when the incline of the workpiece W is detected. In this case, it is possible to detect the inclined state of the workpiece W quantitatively.

The incline detector 55 may detect the angle of incline of the workpiece W based on the abnormal value and the value closest to the abnormal value out of the values included in the other of the first mapping data and the second mapping data when either one of the first mapping data and the second mapping data contains an abnormal value. Because the workpieces W never intersect each other, the workpiece W which indicated an abnormal value in one of the first mapping data and the second mapping data is highly likely to indicate the value closest to the abnormal value in the other of the first mapping data and the second mapping data. Thus, according to the above-described configuration, it is possible to easily identify which workpiece W is inclined and to detect the angle of incline on the workpiece W.

The incline detector may detect whether the workpiece W is positioned across at least two of the planned storage locations in a plurality of stages based on the angle of incline of the workpiece W and the distance between the planned storage locations of the workpiece W. When inserting the robotic hand 21 into a space that is adjacent to the inclined workpiece W across the planned storage locations in multiple stages, it is highly likely that the robotic hand 21 breaks the workpiece W. Accordingly, by detecting whether the inclined workpiece W is positioned across at least two of the planned storage locations in a plurality of stages, it is possible to obtain the information further useful to prevent the breakage of the workpiece W.

The robot system 1 may further include the entry permission/prohibition determination module 56 configured to determine the permission or the prohibition of entry of the robotic hand 21 into a space adjacent to the inclined workpiece based on the detection result by the incline detector 55. In this case, because the permission or the prohibition of entry of the robotic hand 21 is determined by the entry permission/prohibition determination module 56, it is possible to prevent the robotic hand 21 from colliding with the inclined workpiece W and breaking the workpiece W when the workpiece W is inclined.

As in the foregoing, the exemplary embodiment has been described. The present invention, however, is not necessarily limited to the above-described embodiment, and various modifications are possible within a scope not departing from the gist thereof. For example, in the robot 10, the robotic hand for transferring the workpiece W and the robotic hand having the sensor 22 may be separate robotic hands.

Furthermore, the above-described transporter 15 is merely one example, and it may be any mechanism as long as it is a mechanism that can move the robotic hand 21 in and out with respect to the cassette 30. For example, the robot 10 may be a robot with more articulations, or a vertically articulated robot. The robot system 1 may include a mechanism that moves the cassette 30 in place of the transporter 15 that moves the robotic hand 21. For example, the robot system 1 may be provided with an elevator that makes the cassette 30 ascend and descend in the vertical direction, and the transporter 15 may be configured with the robot 10 and the cassette 30.

Figure 5:
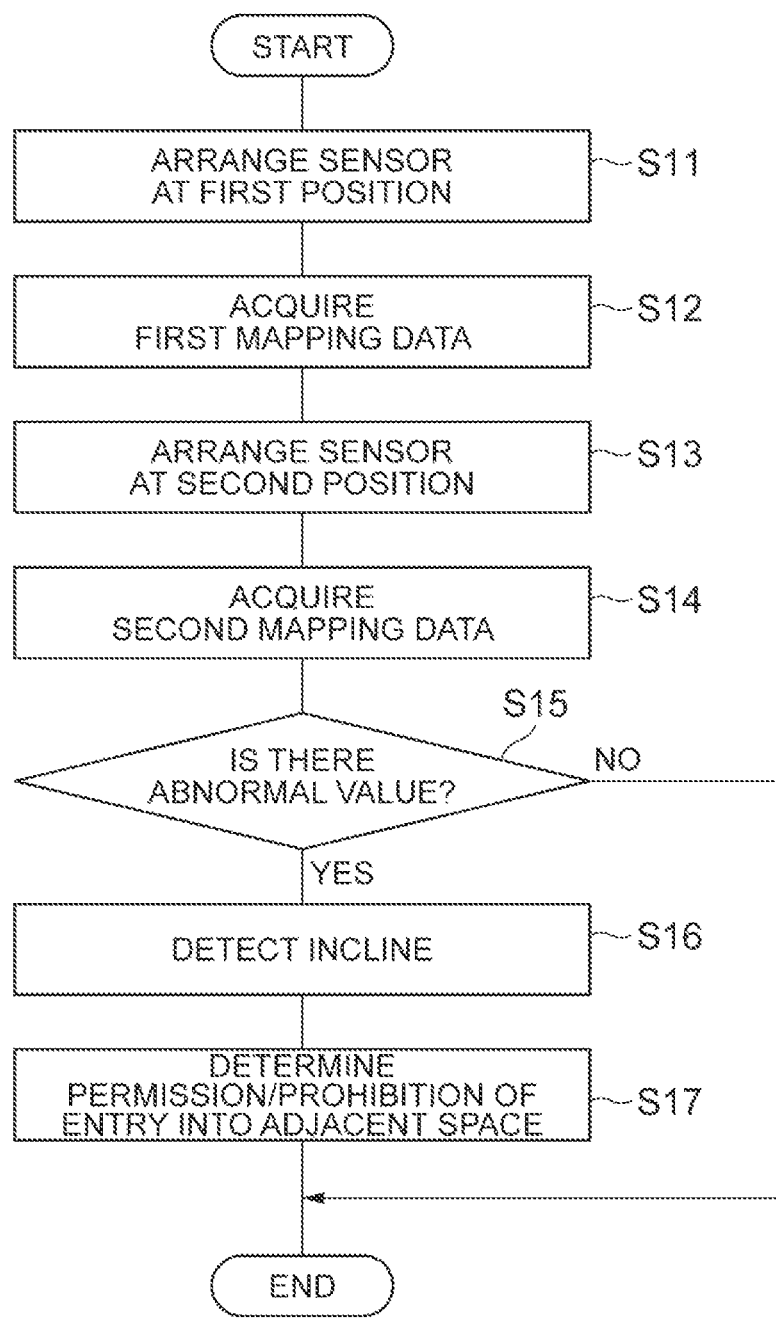
FIG. 5 is a flowchart illustrating processes performed by the controller.

In the processes illustrated in FIG. 5, the determination process at Step S15 may be omitted, and the angle of incline may be calculated, based on all the combinations of the first mapping data and the second mapping data, on all the workpieces W.

Furthermore, the robotic hand 21 may be provided with two pairs of the sensors 22 that are spaced apart from each other in the direction of loading and unloading the workpiece W into and from the cassette 30. In this case, the first scan controller 51 and the second scan controller 52 may be integrated as a single controller that, by controlling the transporter 15 so as to arrange one of the two pairs of the sensors 22 at the first position, arrange the other at the second position, and command the two pairs of the sensors 22 to scan in the aligned direction of the workpieces W in the cassette 30, acquire the first mapping data by one of the sensors 22 and acquire the second mapping data by the other of the sensors 22. In this case, because it is possible to acquire both of the first mapping data and the second mapping data by a single scan, the incline detection can be carried out in a shorter time.

Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modification as would fall within the scope and spirit of the inventions.

Certain aspects, advantages, and novel features of the embodiment have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The invention claimed is:

1. A robot system comprising:
   a robotic hand configured to load and unload a workpiece into and from a cassette in which a plurality of workpieces are accommodated and aligned in a first direction;
   a sensor configured to detect the workpiece;
   a transporter configured to change a relative position of the sensor with respect to the cassette in the first direction and in a second direction intersecting the first direction; and
   circuitry configured to control the transporter and command the sensor;
   wherein the sensor is configured to scan in the first direction while the transporter changes the relative position of the sensor in the first direction, with the sensor arranged at a first position, so as to acquire first mapping data indicating placement of the workpieces in the first direction;
   wherein the transporter is configured to arrange the sensor at a second position by changing the relative position of the sensor in the second direction;
   wherein the sensor is further configured to scan in the first direction while the transporter changes the relative position of the sensor in the first direction, with the sensor arranged at the second position, so as to acquire second mapping data indicating the placement of the workpieces in the first direction; and
   wherein the circuitry is configured to determine that one or more of the workpieces are inclined based on the first mapping data and the second mapping data.

2. The robot system according to claim 1, wherein the second direction is a direction in which the robotic hand loads and unloads the workpiece into and from the cassette.

3. The robot system according to claim 1, wherein the circuitry is further configured to detect, in at least one of the first mapping data and the second mapping data, an abnormal value that indicates a deviation in position of a workpiece that is inclined with respect to a planned storage location of the workpiece in the cassette, and detect the inclined workpiece when at least one of the first mapping data and the second mapping data contains the abnormal value.

4. The robot system according to claim 3, wherein the second direction is a direction in which the robotic hand loads and unloads the workpiece into and from the cassette, and the circuitry is configured to detect the abnormal value based on a difference between the first mapping data and the second mapping data by collating the first mapping data and the second mapping data.

5. The robot system according to claim 3, wherein the circuitry is further configured to calculate an angle of incline of the inclined workpiece based, at least in part, on the abnormal value.

6. The robot system according to claim 5, wherein the circuitry is configured to detect the angle of incline of the inclined workpiece based on a comparison between the abnormal value and a closest value to the abnormal value, and wherein:
   the abnormal value is contained in the first mapping data and the closest value is selected from values contained in the second mapping data, or
   the abnormal value is contained in the second mapping data and the closest value is selected from values contained in the first mapping data.

7. The robot system according to claim 6, wherein the circuitry is configured to calculate the angle of incline based on a difference between the abnormal value and the value closest to the abnormal value and a difference between the first position and the second position in the second direction.

8. The robot system according to claim 5, wherein the circuitry is further configured to detect whether the inclined workpiece is positioned across two of planned storage locations based on the angle of incline of the inclined workpiece and a distance between the planned storage locations of the workpieces.

9. The robot system according to claim 3, wherein the circuitry is configured to detect that the inclined workpiece is positioned across two of the planned storage locations when a difference in height of opposite ends of the inclined workpiece is larger than the distance between the planned storage locations.

10. The robot system according to claim 9, wherein the circuitry is configured to prohibit entry of the robotic hand into at least one of the two planned storage location in response to determine that one or more of the workpieces are inclined.

11. The robot system according to claim 3, wherein the circuitry is configured to prohibit entry of the robotic hand into a first space including the planned storage location in response to detecting the inclined workpiece.

12. The robot system according to claim 3, wherein the circuitry is further configured to prohibit entry of the robotic hand into a second space located adjacent to a first space including the planned storage location.

13. The robot system according to claim 12, wherein the second space is located adjacent to the first space in the first direction.

14. The robot system according to claim 1, wherein the sensor is provided on the robotic hand.

15. The robot system according to claim 14, wherein the sensor includes a light projecting unit and a light receiving unit facing each other at distal ends of the robotic hand.

16. The robot system according to claim 15, wherein the circuitry is further configured to detect a decreased amount of received light by the light receiving unit, and acquire a position of the sensor in response to detecting the decreased amount of received light.

17. The robot system according to claim 16, wherein the transporter is configured to move the robotic hand along the first direction in order to acquire a plurality of positions of the sensor as the first mapping data and the second mapping data indicating the placement of the workpieces.

18. The robot system according to claim 1, wherein the transporter includes:
   at least one actuator which moves the robotic hand along the first direction; and at least one actuator which moves the robotic hand along the second direction.

19. A robot system comprising:

a robotic hand configured to load and unload a workpiece into and from a cassette in which a plurality of workpieces are accommodated in multiple stages and aligned in a first direction;

a sensor configured to detect the workpiece;

means for changing a relative position of the sensor with respect to the cassette from a first position to a second position by changing the relative position of the sensor in a second direction intersecting the first direction;

means for changing the relative position of the sensor in the first direction when the sensor is located at the first position so that the sensor acquires first mapping data indicating placement of the workpieces in the first direction, and changing the relative position of the sensor in the first direction when the sensor is located at the second position so that the sensor acquires second mapping data indicating the placement of the workpieces in the first direction; and means for determining a state of incline of one or more of the workpieces based on the first mapping data and the second mapping data.

20. A method comprising:

arranging a sensor at a first position with respect to a cassette including multiple storage locations in which a plurality of workpieces are aligned in a first direction;

commanding the sensor to scan in the first direction, while changing a relative position of the sensor with respect to the cassette, with the sensor arranged at the first position;

acquiring first mapping data with the sensor arranged at the first position, the first mapping data indicating placement of the workpieces in the first direction;

arranging the sensor at a second position different from the first position by changing the relative position of the sensor in a second direction intersecting the first direction;

commanding the sensor to scan in the first direction, while changing the relative position of the sensor in the first direction, with the sensor arranged at the second position;

acquiring second mapping data with the sensor arranged at the second position, the second mapping data indicating the placement of the workpieces in the first direction;

determining that one or more of the workpieces are inclined based on the first mapping data and the second mapping data; and prohibiting entry of a robotic hand into at least one of the storage locations in response to determining that one or more of the workpieces are inclined.

21. A non-transitory memory device having instructions stored thereon that, in response to execution by a processing device, cause the processing device to perform operations comprising:

arranging a sensor at a first position with respect to a cassette including multiple storage locations in which a plurality of workpieces are aligned in a first direction;

commanding the sensor to scan in the first direction, while changing a relative position of the sensor with respect to the cassette, with the sensor arranged at the first position;

acquiring first mapping data with the sensor arranged at the first position, the first mapping data indicating placement of the workpieces in the first direction;

arranging the sensor at a second position different from the first position by changing the relative position of the sensor in a second direction intersecting the first direction;

commanding the sensor to scan in the first direction, while changing the relative position of the sensor in the first direction, with the sensor arranged at the second position;

acquiring second mapping data with the sensor arranged at the second position, the second mapping data indicating the placement of the workpieces in the first direction;

determining that one or more of the workpieces are inclined based on the first mapping data and the second mapping data; and prohibiting entry of a robotic hand into at least one of the storage locations in response to determining that one or more of the workpieces are inclined.

* * * * *